(12) United States Patent
Maeda et al.

(10) Patent No.: US 9,236,123 B2
(45) Date of Patent: Jan. 12, 2016

(54) SEMICONDUCTOR DEVICE AND WRITE METHOD

(71) Applicant: MICRON TECHNOLOGY, INC., Boise, ID (US)

(72) Inventors: Akiko Maeda, Tokyo (JP); Shuichi Tsukada, Tokyo (JP); Yusuke Jono, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/495,775

(22) Filed: Sep. 24, 2014

(65) Prior Publication Data

US 2015/0085561 A1  Mar. 26, 2015

(30) Foreign Application Priority Data

Sep. 25, 2013 (JP) .................................. 2013-198184

(51) Int. Cl.
| | |
|---|---|
| *G11C 11/00* | (2006.01) |
| *G11C 13/00* | (2006.01) |
| *G11C 7/04* | (2006.01) |
| *G11C 16/20* | (2006.01) |
| G11C 29/00 | (2006.01) |

(52) U.S. Cl.
CPC .............. *G11C 13/0069* (2013.01); *G11C 7/04* (2013.01); *G11C 13/0002* (2013.01); *G11C 13/004* (2013.01); *G11C 16/20* (2013.01); *G11C 29/70* (2013.01); *G11C 2013/009* (2013.01); *G11C 2013/0054* (2013.01); *G11C 2013/0083* (2013.01)

(58) Field of Classification Search
USPC ..................... 365/148, 189.09, 158, 159, 163
See application file for complete search history.

(56) References Cited

U.S. PATENT DOCUMENTS

| | | | |
|---|---|---|---|
| 8,411,488 B2 | 4/2013 | Kawabata et al. | |
| 2011/0110144 A1* | 5/2011 | Kawai ................ | G11C 11/5685 365/148 |
| 2014/0185360 A1* | 7/2014 | Kawai ................ | G11C 13/0007 365/148 |

* cited by examiner

*Primary Examiner* — Vu Le
(74) *Attorney, Agent, or Firm* — Dorsey & Whitney LLP

(57) ABSTRACT

A semiconductor device includes a memory cell array including a plurality of first and second memory cells each comprising a variable resistance element that establishes an electrical resistance that changes in response to an application of a write voltage after a forming voltage has been applied, the first memory cell to which the forming voltage is applied, and the second memory cell to which the forming voltage is not applied, and the second memory cell being configured to store one of first and second logic values constituting first information, the first and second logic values being different from each other.

20 Claims, 14 Drawing Sheets

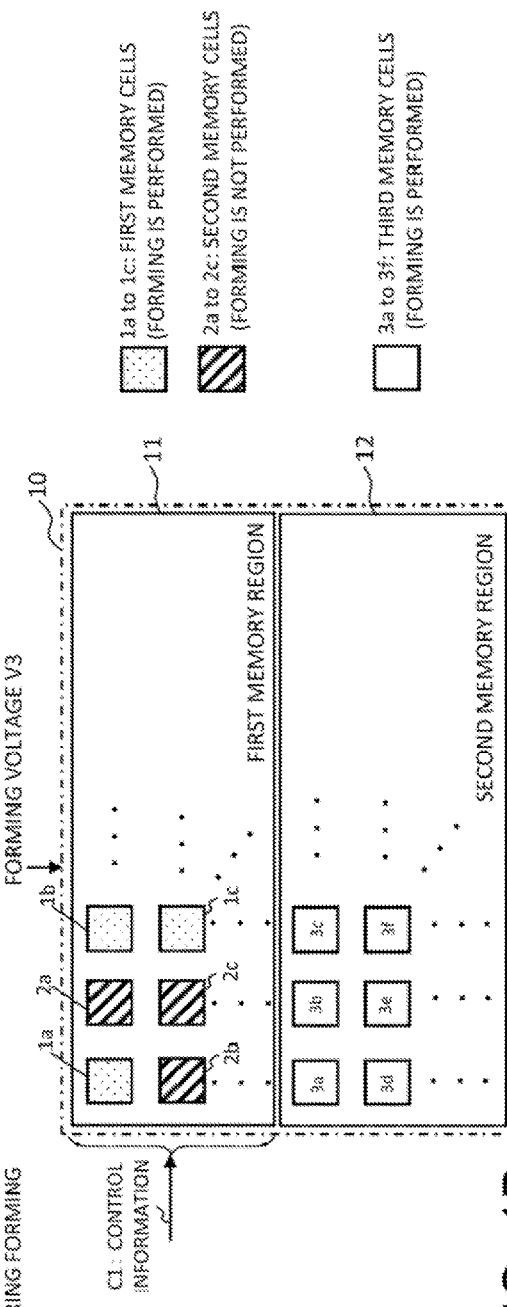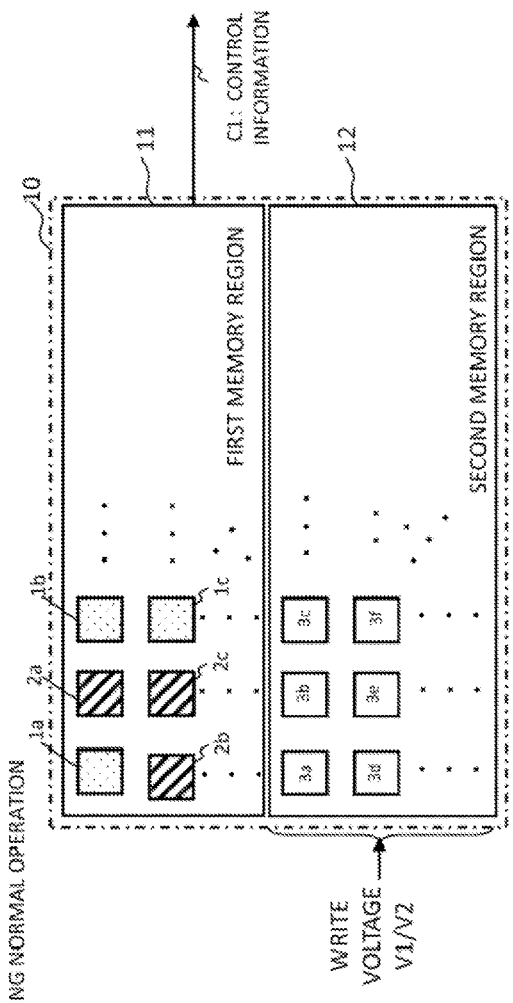

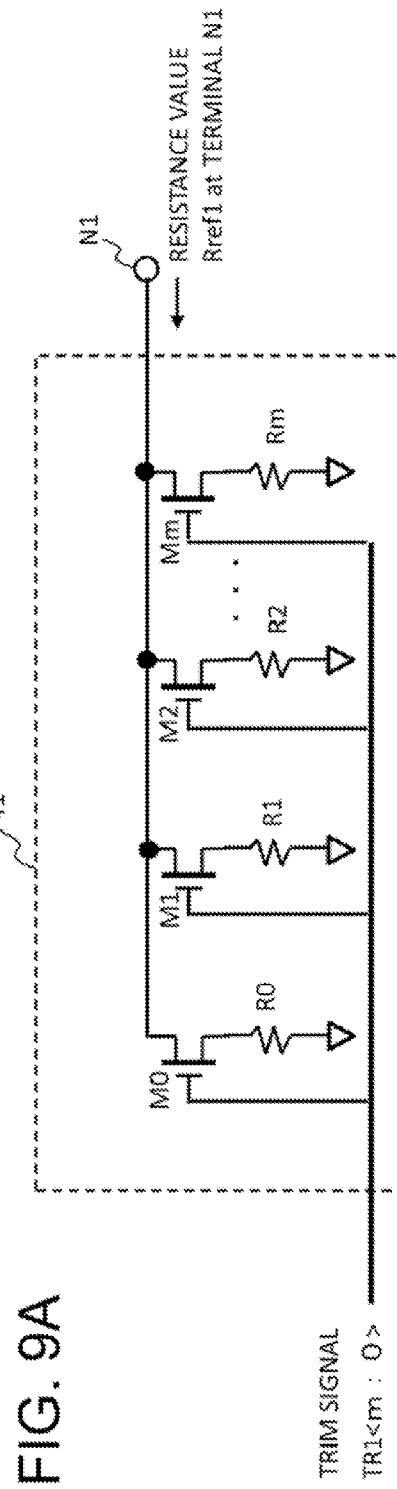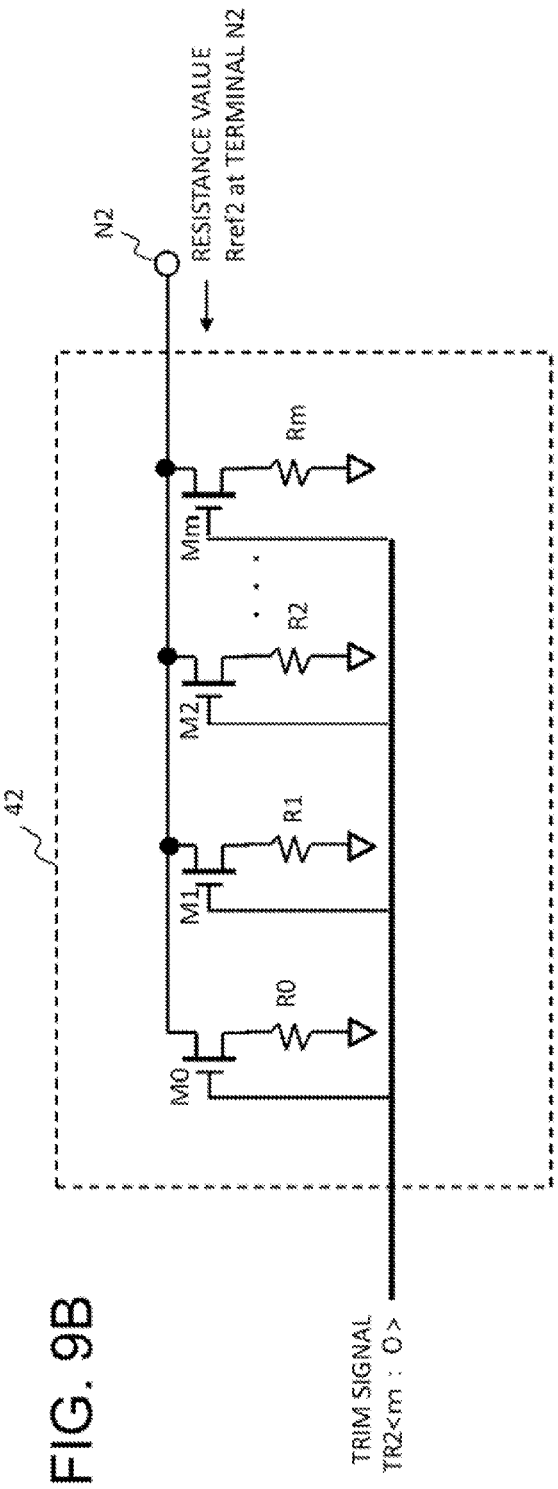

BEFORE HIGH-TEMPERATURE TREATMENT

AFTER HIGH-TEMPERATURE TREATMENT

BEFORE HIGH-TEMPERATURE TREATMENT

AFTER HIGH-TEMPERATURE TREATMENT

SEMICONDUCTOR DEVICE AND WRITE METHOD

REFERENCE TO RELATED APPLICATION

This application is based upon and claims the benefit of the priority of Japanese patent application No. 2013-198184, filed on Sep. 25, 2013, the disclosure of which is incorporated herein in its entirety by reference thereto.

TECHNICAL FIELD

The present invention relates to a semiconductor device comprising a variable resistance element as a memory element and a write method for a semiconductor device.

BACKGROUND

Nowadays, flash memory is widely used in nonvolatile semi con doctor devices. For the purpose of replacing the flash memory, various memory cells are being developed. Particularly known are variable resistance memory cells that store the information of logic 0 and logic 1 using a variable resistance element according to the resistance state thereof.

Variable resistance elements include, for instance, a Re-RAM (Resistive-Random Access Memory) using a metal oxide, sod an STT-RAM (Spin-Transfer Torque Random Access Memory) that performs spin, transfer torque writing using an MTJ (Magnetic Tunnel Junction) element.

The variable resistance element of a ReRAM is initially in a insulated state after being manufactured, and a predetermined voltage (i.e., forming voltage) must be applied to the manufactured variable resistance element to form a filament path inside therein so as to be able to switch between two states: high resistance and low resistance states. This process of forming a filament path is called "forming." After the forming, the high and low resistance states can be stably switched in response to application of a write voltage different from the forming voltage, achieving a stable memory operation.

Patent Literature 1 discloses a semiconductor memory device comprising a ReRAM as a variable resistance element. A forming is performed on the semiconductor memory device before shipped from tire factory. After the forming, product-specific information for each product (for instance redundancy relieving information if redundancy has been relieved, defect block address information, and product information such as a product number) is acquired as initialization data at a test stage.

Patent Literature 1:
Japanese Patent Kokai Publication No. JP-P2012-79367A, which corresponds to US Patent Application Publication No. US2012/081946A1 and U.S. Pat. No. 8,411,488B2.

SUMMARY

The disclosure of the above Patent Literature is hereby incorporated by reference into this specification. The following analysis given from the standpoint of the present invention.

In the variable resistance element of the ReRAM described in Patent Literature 1, the forming described above is performed on all memory cells constituting a memory cell array.

Here, the memory cells treated with the forming are able to store normal information and control information. The normal information is user data, i.e., information externally supplied to a data terminal of the chip when the chip is used by a user after being shipped from the factory (during normal operation of the semiconductor memory device). This information is determined by the semiconductor device in which the chip is used and how it is used; for instance, it may be image or music data. Further, the control information is information used when a memory cell array that stores the initialization data and the normal information is controlled. Examples include the information of values used for generating a write voltage or reference voltage. Both kinds of information are stored by the memory cells on which the forming has been performed. The memory cells treated with the forming switch between high and low resistance states in response to application of a write voltage and store information as a result. In these high and low resistance states, the memory cells have resistance values lower than they did in a resistance state (a state close to a so-called insulated state) before the forming.

Particularly, Patent Literature 1 does not disclose any technological concept to utilize memory cells that have not been treated with the forming as elements storing information. In other words, in this document, memory cells in a state before being treated with the forming (i.e., memory cells that, have not been treated with the forming) are not constituted to store any information; they do not store the normal information or the control information described above.

Next, in Patent Literature 1, logical value information indicated by each of the high and low resistance states reversibly possessed by the memory cells treated with the forming is ideally read with an intermediate resistance value as a reference. As far as the read margin is concerned, the larger the resistance value difference between a the high and low resistance states indicated by the memory cells, the larger the amount of the difference (i.e., the read margin) between this reference resistance value and the high resistance value indicated by the cells (or between the reference resistance value and the low resistance value indicated by the cells).

In general memory devices, including a ReRAM, the read margin is a constant value, although it is normally determined by various factors such as the size, material, etc, of the memory device. In general, a larger read margin is desired since larger margins decrease read errors and contribute to improving the reliability of information storage.

According to a first aspect of the present invention, there is provided a semiconductor memory device including a memory cell array including a plurality of first and second memory cells each including a variable resistance element that establishes an electrical resistance that changes in response to an application of a write voltage after a forming voltage has been applied, the first memory cell to which the forming voltage is applied, and the second memory cell to which the forming voltage is not applied, and the second memory cell being configured to store one of first and second logic values constituting first information, the first and second logic values being different from each other.

According to a second aspect of the present invention, there is provided a method in eluding pet forming a write operation on a plurality of memory cells each including a variable resistance element to write first information including first and second logic values that are different from each other, and the write operation including storing the first logic value in a first one of the memory cells by applying a forming voltage to the first one of the memory cells, and storing the second logic value in a second one of the second memory cells by not applying the forming voltage to the second one of the second memory cells.

The meritorious effects of the present invention are summarized as follows, but not restricted thereto. According to the present invention, by utilizing a variable resistance element not treated with a forming as a memory element, information can be stored with a larger read margin, and a semiconductor memory device and method capable of contributing to the improvement of the reliability of information storage can be provided.

BRIEF DESCRIPTION OF THE DRAWINGS

FIGS. 1A and 1B are drawings showing a configuration of a semiconductor memory device relating to an exemplary embodiment.

FIGS. 9A and 9B are circuit diagrams of first and second reference resistance circuits of the semiconductor memory device relating to the first exemplary embodiment.

PREFERRED MODES

Figure 2A:
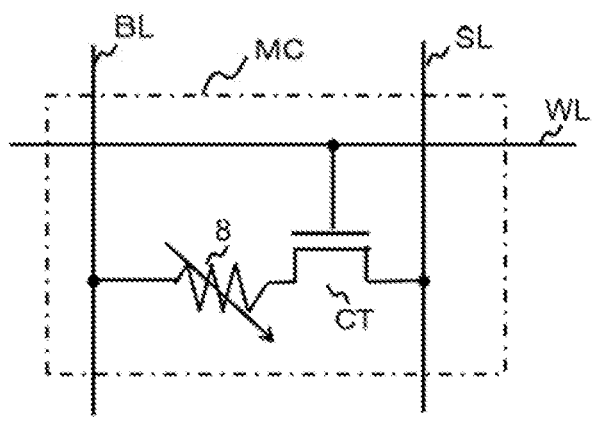
FIGS. 2A and 2B are drawings showing configurations of a memory cell and a variable resistance element of the semiconductor memory device relating to an exemplary embodiment.

In the present disclosure, there are various possible modes, which include the following, but not restricted thereto. First, a summary of an exemplary embodiment of the present invention will be given. Note that drawing reference signs in the exemplary embodiment summary are provided as examples solely for facilitating understanding and they are not intended to limit the present invention to the exemplary embodiments shown in the drawings.

A semiconductor memory device in an exemplary embodiment is configured as shown in FIGS. 1A and 1B. Here, FIG. 1A shows a case where the semiconductor memory device is treated with a forming at the time of shipping adjustments, and FIG. 1B shows a case where it operates normally. Further, FIG. 2B shows the configuration of a variable resistance element 8 included in each of first to third memory cells in FIGS. 1A and 1B.

The semiconductor memory device includes a memory cell array 10 that includes a plurality of memory cells (1a to 1c, 2a to 2c, 3a to 3f, etc.), each including a variable resistance element 8. An electrical resistance of the variable resistor 7 reversibly changes in response to an application of a write voltage after a forming voltage V3 has been applied. The memory cell array 10 includes first memory cells (1a to 1c), to which the forming voltage V3 is applied, and second memory cells (2a to 2c), to which the forming voltage V3 is not applied. The second memory cells 2a to 2c are configured to store one of a first logic value (for instance "1") and a second logic value (for instance "0"), different from each other and constituting first information.

In the configuration described above, when the first information is stored in the memory cell array 10, one of the logic values that constitute the first information, the first or second logic value, is stored by not treating the second memory cells with a forming. Since a resistance state without a forming has super high resistance (a resistance state close to an insulated state). It becomes possible to store the first information with a large read margin.

An exemplary embodiment of the present invention will be described in detail with reference to the drawings.

First Exemplary Embodiment

Configuration of First Exemplary Embodiment

A configuration of a semiconductor memory device 100 relating to a first exemplary embodiment will be described with reference to FIG. 3.

Figure 3:
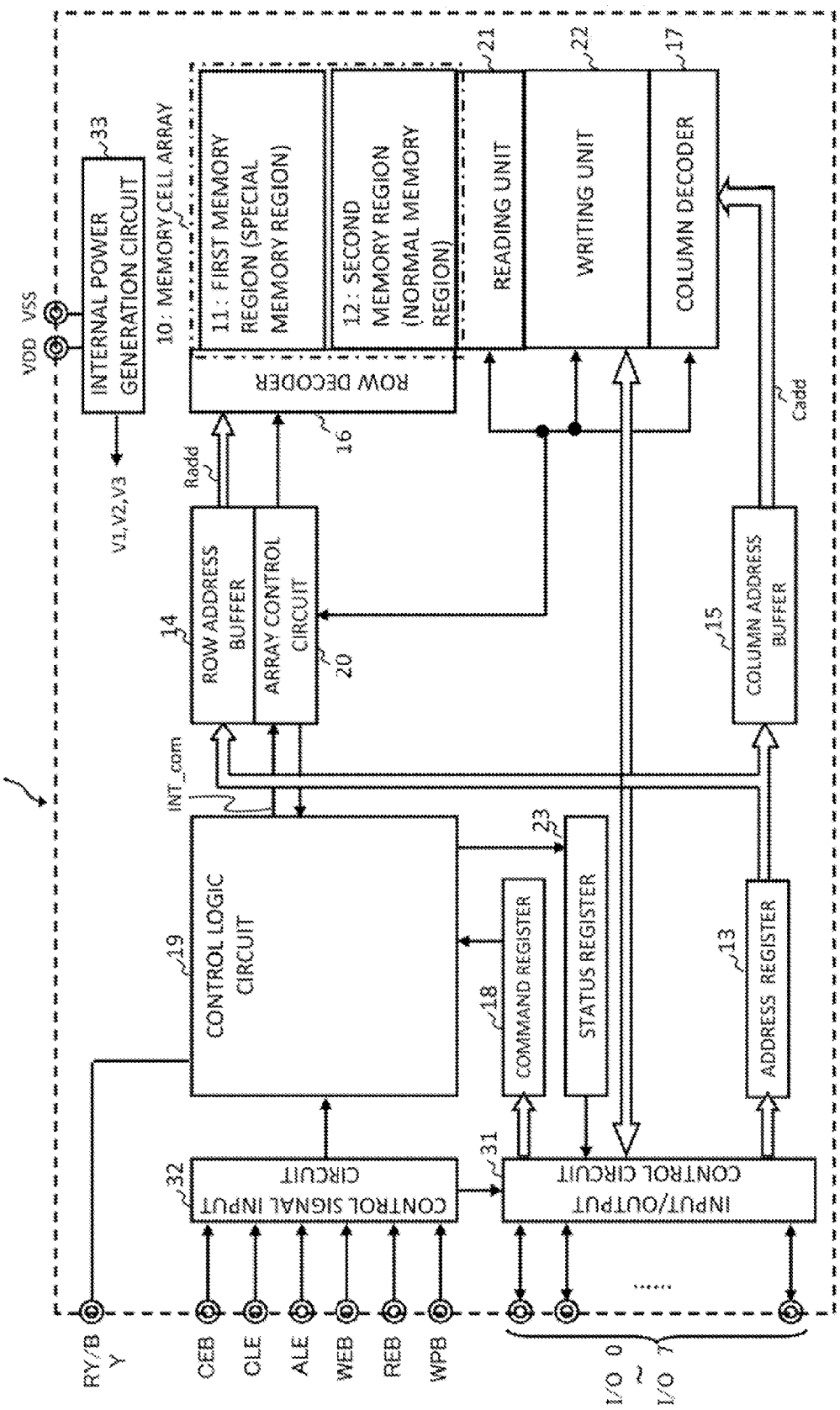
FIG. 3 is a block diagram showing a schematic configuration of a semiconductor memory device relating to a first exemplary embodiment.

FIG. 3 shows a schematic configuration of the semiconductor memory device 100 relating to the first exemplary embodiment.

The semiconductor memory device 100 is constituted by including the memory cell array 10, an input/output control circuit 31, a control signal input circuit 32, an address register 13, a row address buffer 14, a column address buffer 15, a row decoder 16, a column decoder 17, a command register 18, a control logic circuit 19, an array control circuit 20, a reading unit 21, a writing unit 22, a status register 23, and an internal power generation circuit 33.

The memory cell array 10 is constituted by a special memory region (a first memory region) 11 and a normal memory region (a second memory region) 12.

The special memory region (the first memory region) 11 is a region that stores the control information. The special memory region 11 stores information using memory cells treated with a forming and memory cells not treated with a forming.

The normal memory region (the second memory region) 12 is a region that stores the normal information. The normal memory region 12 stores information using only the memory cells treated with a forming. A memory cell array in an actual ReRAM memory product sometimes has memory cells for which forming is not completed due to some technical defects even though a forming voltage has been applied thereto, however, these memory cells are not taken into consideration here.

The entire memory cell array 10 is constituted by a plurality of memory cells MC arranged in a matrix in rows and columns. The plurality of memory cells MC are constituted by special memory cells included in the special memory region 11 and normal memory cells included in the normal memory region 12.

In the memory cell array 10, a word line WL is provided corresponding to each row of the memory cells CM, and a bit line BL and a source line SL are provided corresponding to each column of the memory cells MC (refer to FIG. 4; details later). Each word line WL is connected to the row decoder 16, and each bit line BL is connected to the reading unit 21 and the writing unit 22.

(Configuration of Memory Cell MC)

Next, with reference to FIGS. 2A and 2B, the configuration of the memory cell MC in the memory cell array 10 will be described.

Figure 2B:
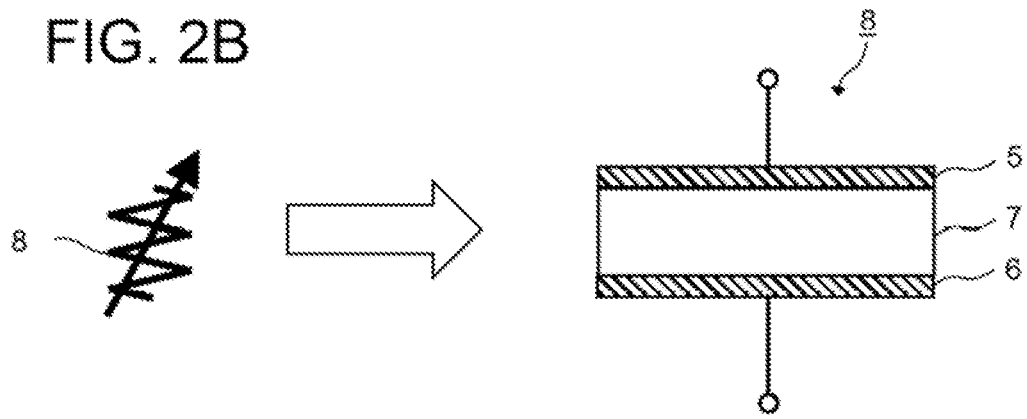

FIG. 2A is a drawing showing the configuration of a single memory cell MC. As shown in FIG. 2A, the memory cell MC is constituted by the variable resistance element 8 and cell transistor CT connected in series. The word line WL is connected to a gate of the cell transistor CT, the bit line BL is connected to an end of the variable resistance element 8, and the source line SL is connected to either a source or drain of the cell transistor CT.

A write operation (programming) is performed by activating the word line WL, turning on the cell transistor CT, and supplying a current to the variable resistance element 8 via the bit line BL and the source line SL. There are two types of write operations: a write operation (set) that changes the state of the variable resistance element 8 from a high resistance state to a low resistance state, and a write operation (reset) that changes the state of the variable resistance element 8 from the low resistance state to the high resistance state. Further, there are two types of write currents: a unipolar type that performs the two types of write operations described above by flowing in one direction between the bit line BL and the source line SL, and a bipolar type that performs the two types of write operations described above by flowing in both directions between the bit line BL and the source line SL. Further, the resistance state of the variable resistance element 8 is read by flowing a current therethrough.

FIG. 2B is a drawing showing the configuration of the variable resistance element 8. The variable resistance element 8 is a ReRAM and configured to comprise the variable resistor 7 interposed between the first and second electrode 5 and 6. The variable resistor 7 is constituted by, for instance, transition metal oxide such as perovskite oxide and NiO. The resistance characteristics of the variable resistance element 8 are changed by applying electrical stress between the first and second electrodes 5 and 6. The variable resistance element 8 is a nonvolatile memory since it maintains a state in which the resistance is changed even after power is cut off.

Writing to the variable resistance element 8 requires two type of write operations: a write operation that changes the high resistance state (corresponding to a third resistance state) to the low resistance state (corresponding to a fourth resistance state), and a write operation that changes the low resistance state to the high resistance state. Hereinafter, the write operation that changes the high resistance state to the low resistance state is referred to as SET write (also referred to as SET), and the write operation that changes the low resistance state to the high resistance state is referred to as RESET write (also referred to as RESET).

Further, in the present description, the low and high resistance states are assumed to be logic values "1" and "0," respectively. In other words, SET write is an operation that writes "1" and RESET write is an operation that writes "0."

There are two types of the SET and RESET write operations: the unipolar type that performs write operations by applying a voltage to the variable resistance element in the same direction in SET and RESET, and the bipolar type that performs write operations by applying a voltage to the variable resistance element in two opposite directions in SET and RESET. The variable resistance element 8 used in the first exemplary embodiment is of the bipolar type.

(Write Operation)

Next, a bipolar write operation will be described more in detail with reference to FIG. 11.

Figure 11:
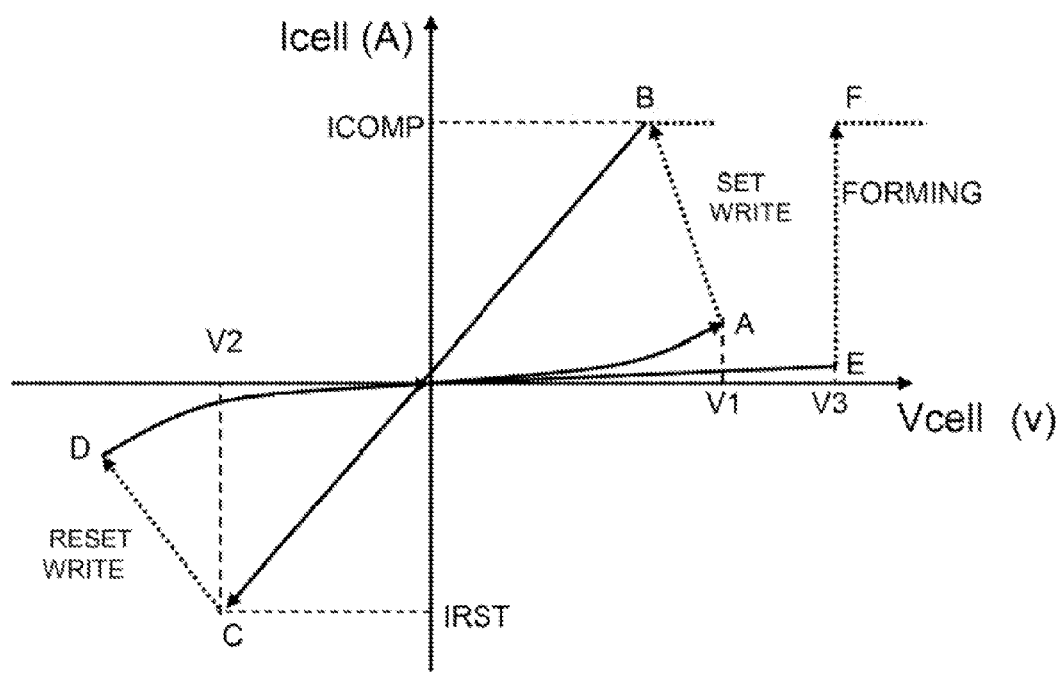
FIG. 11 is an 1-V characteristic diagram of the variable resistance element in the first exemplary embodiment.

In FIG. 11, a voltage Vcell applied between the electrodes of the variable resistance element on a horizontal axis and a current value Icell that flows between both ends at that time on a vertical axis are plotted. The variable resistance element 8 is initially assumed to be in the high resistance state, having a high resistance value. By applying the positive voltage V1 between the electrodes of the variable resistance element 8 in this high resistance state (point A in FIG. 11), the variable resistance element 8 is set from the high resistance state into the low resistance state (changed from the point A to point B in FIG. 11). The maximum current that flows at this time is ICOMP.

Conversely, a write operation to change the low resistance state to the high resistance state applies a voltage in the opposite direction from the direction of the write operation to change the low resistance state to the high resistance state. In other words, the voltage V2 is applied to the variable resistance element 8 in the low resistance state in the opposite direction from the direction of SET (point C in FIG. 11). A current that flows at this time is IRST. Then, the variable resistance element 8 is reset from the low resistance state and returns to the high resistance state (changes from the point C to point D).

The variable resistor 7 of the variable resistance element is initially in a super high resistance state (a resistance state close to an insulated state) immediately after film formation, and in order to enable it to switch between the high and low resistance states, a predetermined voltage (the forming voltage V3) must be applied to the variable resistance element 8 after being manufactured to form a filament path inside therein. This process of forming a filament path is called forming. After the forming, the high and low resistance states can be stably switched, achieving a stable memory operation.

(Forming Operation)

Next, a forming operation will be described with reference to FIG. 11.

In FIG. 11, point E is a state in which the forming voltage V3 is applied to the variable resistance element 8 in the super high resistance state. After the forming, a filament path is formed and then the variable resistance element transitions from, the point E to point F. The resistance state after the forming (the point F) has a resistance value same as or close to that of the low resistance state after a SET write (the point B). FIG. 11 indicates that, the resistance value of the point F is close to the resistance value of the point B.

The resistance state of each point in FIG. 11 is summarized as follows. The point E is the super high resistance state (corresponding to the second resistance state) before a forming. The point F is the low resistance state (corresponding to the first resistance state and same as or close to the low resistance state after a SET write) after a forming. The points A and D are the high resistance state (corresponding to the third resistance state) after a RESET write during normal, operation. The points B and C are the low resistance state (corresponding to the fourth resistance state) after a SET write during normal operation.

(Configuration of Each Unit in FIG. 3)
Next, returning to FIG. 3, the configuration of each unit in FIG. 3 will be described.

The semiconductor memory device 100 is configured to be used as a large capacity data storage device and have command codes, address input, input data, output data, and status codes entered/outputted from the input/output control, circuit 31 via eight I/O terminals (I/Os 0 to 7) in order to limit the number of terminals.

A control signal supplied to the control signal input circuit 32 controls whether feeding an address, data, or status code or outputting data, or a status code is performed in the input/output control circuit 31. As shown in FIG. 3, as the control signals, a chip enable signal CEB, command latch enable signal CLE, address latch enable signal ALE, write enable signal WEB, read enable signal REB, and write protect signal WPB are used.

When the command enable signal CLE is at a high level, it is synchronized with the write enable signal WEB, and one to several bytes of a command code are read by the input/output control circuit 31 and forwarded to the command register 18. The command code forwarded to the command register 18 is decoded by the control logic circuit 19, and the processes in an operation mode according to the content of the decoded command code are controlled by the control logic circuit 19.

When the address latch enable signal ALE is at a high level, it is synchronized with, the write enable signal WEB, and an address entry is read by the input/output control circuit 31. The read address entry is stored in the address register 13.

A row address Radd in the address entry stored in the address register 13 is forwarded to the row address buffer 14 and is provided to the row decoder 16. Further, a column address Cadd in the address entry stored in the address register 13 is forwarded to the column address buffer 15 and is provided to the column decoder 17. The row decoder 16 selects a word line WL corresponding to the row address Radd. The column decoder 17 selects a bit line BL corresponding to the column address Cadd. (More concretely, a Y-select signal (not shown in the drawing) corresponding to the column address Cadd is supplied to the reading unit 21 and a writing unit 22a, and the information of the bit line BL corresponding to the Y-select signal is entered/outputted.) As a result, a memory cell MC located at the intersection of the selected word line WL and bit line BL is accessed.

The control logic circuit 19 outputs a necessary control signal INT_com to the array control circuit 20 on the basis of control processes predetermined for each operation mode specified by the command code stored in the command register 18. Then, the array control circuit 20 controls each operation of the row decoder 16, the column decoder 11, the reading unit 21, and the writing unit 22 according to the control signal INT_com from the control logic circuit 19.

Further, as an operation mode, there is a status read operation that reads a status code indicating the internal status of the semiconductor memory device 100. The status register 23 temporarily stores the status codes in which the internal statuses updated regularly by the control logic circuit 19 are encoded, and the content of the status register 23 is forwarded to the input/output control circuit 31 and outputted from an I/O terminal in the status read operation.

A signal at a RY/BY (Ready/Busy) terminal is controlled by the control logic circuit 19. For instance, when the semiconductor memory device 100 is performing a write operation and unable to receive any other command, the RY/BY terminal is driven to a low level.

Further, the internal power generation circuit 33 generates voltages required in the semiconductor memory device 100 from power supply voltages VDD and VSS supplied externally. More concretely, the internal power generation circuit 33 generates and supplies the write voltage V1 for a first write circuit (51 in FIG. 4), the write voltage V2 for a second write circuit (52a in FIG. 4), and the forming voltage V3 for a forming circuit (53 in FIG. 4).

Figure 4:
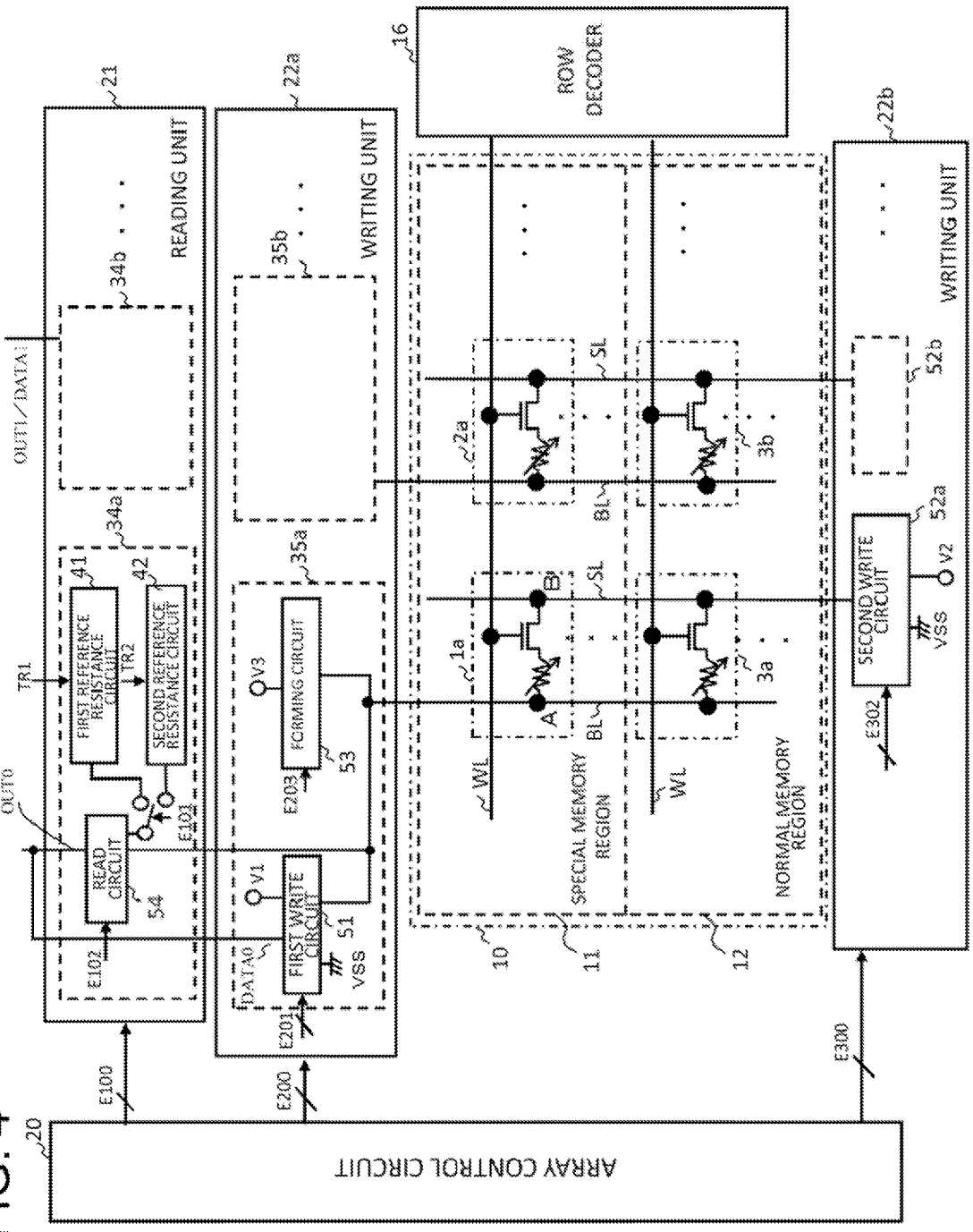
FIG. 4 is a block diagram showing a configuration of peripheries of a memory cell array in the semiconductor memory device relating to the first exemplary embodiment.

FIG. 4 shows the configuration of peripheries of the memory cell array in the semiconductor memory device relating to the first exemplary embodiment.

Next, with reference to FIG. 4, the configuration of the peripheries of the memory cell array 10 in FIG. 3 will be described more in detail. The writing unit 22 in FIG. 3 is shown separated into a writing unit 22a that drives the bit line BL and a writing unit 22b that drives the source line SL in FIG. 4. In FIG. 4, E100, E200, E300, E101, E102, E201, E203, and E302 are control signals with which the array control circuit 20 controls the reading unit 11 and the writing units (22a and 22b).

FIG. 4 shows the special memory cells (1a and 2a) and the normal memory cells (3a and 3b) in the special memory region 11 and the normal memory region 12, respectively (1a, 2a, 3a, and 3b in FIG. 4 correspond to the memory cells having the same reference signs in FIG. 1).

Next, the configuration of the writing unit 22a will be described. In the writing unit 22a, a writing unit (35a, 35b, etc.) for each bit is provided for each bit line BL, which is connected to the corresponding writing unit for each bit. As shown in FIG. 4, the writing unit (35a, 35b, etc) for each bit is constituted by including the first write circuit 51 and the forming circuit 53.

The forming circuit 53 is a circuit that applies the forming voltage V3 to perform a forming on the entire normal memory region 12 and perform a forming (described in detail later) on the special memory cell (the first memory cell) to which the logic value "1" is written in the special memory region 11.

Figure 5:
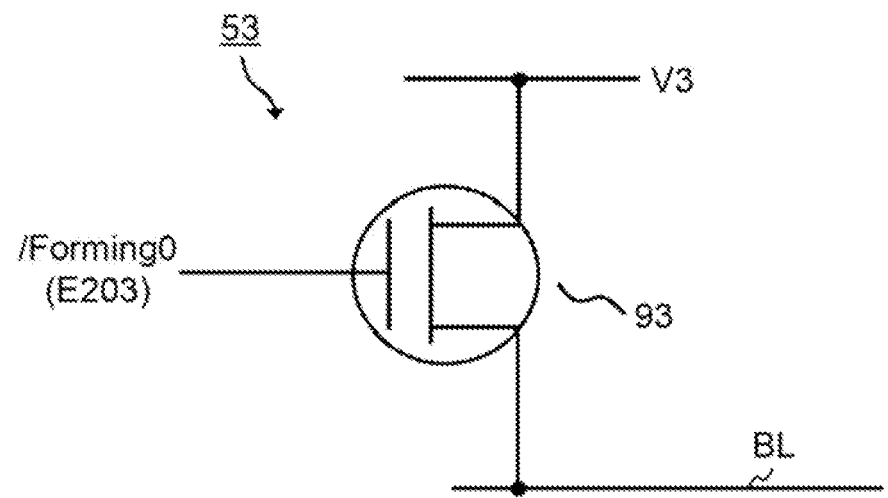
FIG. 5 is a circuit diagram of a forming circuit of the semiconductor memory device relating to the first exemplary embodiment.

FIG. 5 shows the configuration of the forming circuit 53.

As shown in FIG. 5, the forming circuit 53 is constituted by a PMOS transistor 93, and the control signal/Forming0 (E203) is supplied to a gate of the PMOS transistor 93. The voltage source of the forming voltage V3 is connected to a source of the PMOS transistor 93, and the PMOS transistor 93 turns on when the control signal/Forming0 is at a low level, applying the forming voltage V3 to the bit line BL.

Further, in the first exemplary embodiment, since a forming must be performed selectively on the special memory region 11, one should be able to per form a forming on a memory cell of a specified address, at least for the special memory region 11.

On the other hand, since the entire normal memory region 12 can be treated with a forming, the forming circuit may be configured to perform a bulk forming on a predetermined block in the normal memory region 12 in order to achieve a high-speed forming.

Figure 6:
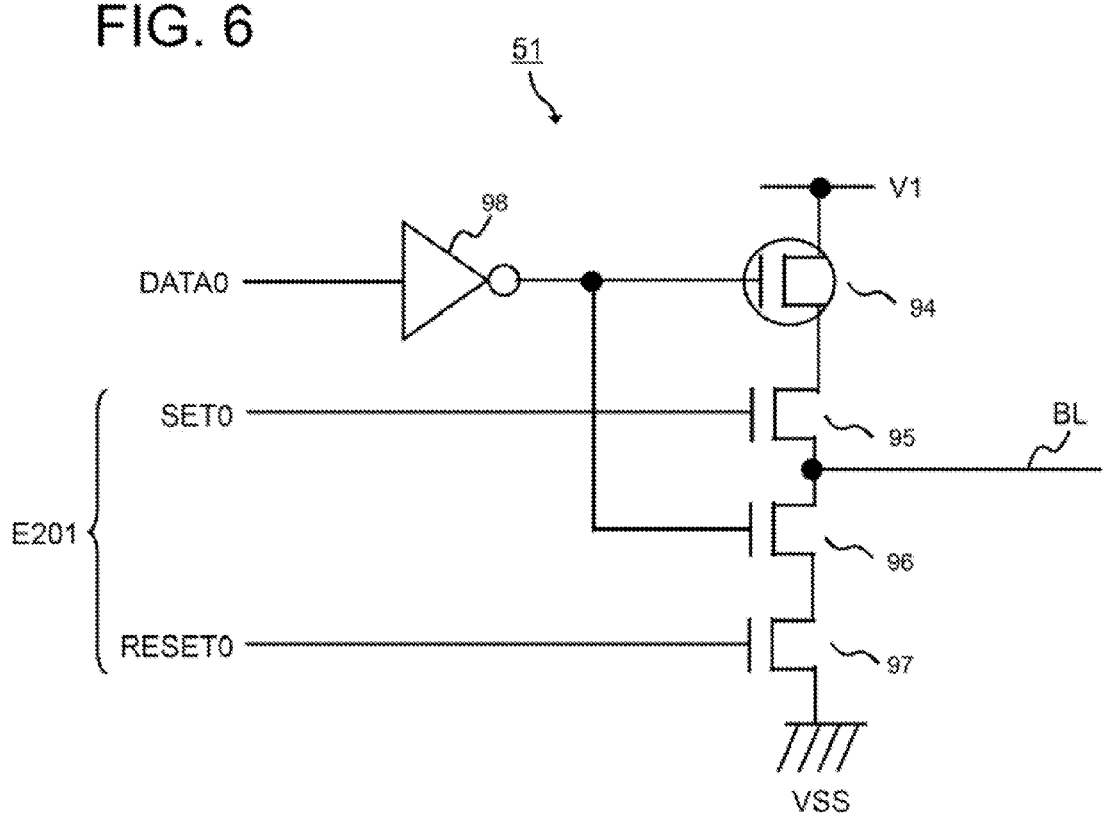
FIG. 6 is a circuit diagram of a first write circuit of the semiconductor memory device relating to the first exemplary embodiment.

FIG. 6 is a circuit diagram of the first write circuit 51 of the semiconductor memory device relating to the first exemplary embodiment.

Next, with reference to FIG. 6, the configuration of the first write circuit 51 will be described. SET0 and RESET0 in FIG. 6 are control signals supplied by the array control circuit 20. SET0 is activated to a high level, during the SET write operation, and RESET0 is activated to a high level during the RESET write operation.

The first write circuit 51 is constituted by including a PMOS transistor 94, HMOS transistors 95 to 97, and an inverter circuit 98. The PMOS transistor 94 and the NMOS transistors 95 to 97 are connected in series between the voltage source V1 and the ground. The wiring of DATA0 is connected to gates of the PMOS transistor 94 and the NMOS transistor 96 via the inverter 98. (DATA0 is write data during normal operation and is the logic value "1" or the logic value "0.") Further, a gate of the NMOS transistor 95 is connected to the wiring of the set signal SET0. A gate of the NMOS transistor 97 is connected to the wiring of the reset signal RESET0.

Next, returning to FIG. 4, the configuration of the writing unit 22b in FIG. 4 will be described. In the writing unit 22b, the second write circuit (52a, 52b, etc.) is provided for each source line SL, which is connected to the corresponding second write circuit (52a, 52b, etc.).

Figure 7:
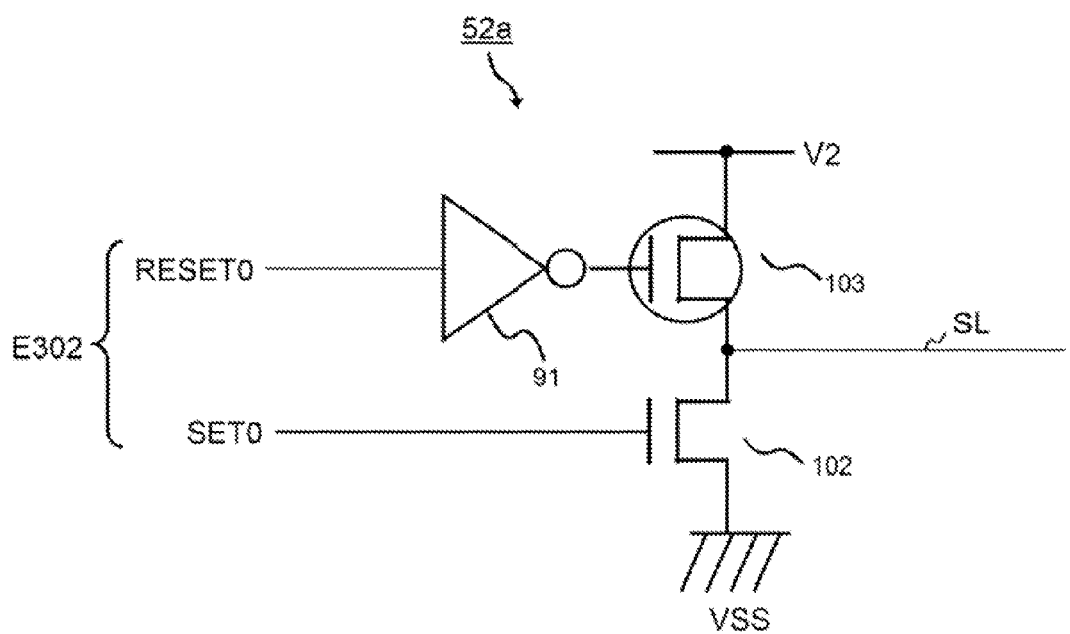
FIG. 7 is a circuit diagram of a second write circuit of the semiconductor memory device relating to the first exemplary embodiment.

FIG. 7 shows a circuit diagram of the second write circuit 52 of the semiconductor memory device relating to the first exemplary embodiment.

The configuration of the second write circuit (52a, 52b, etc) will be described with reference to FIG. 7, The second write circuit 52a is constituted by including a PMOS transistor 103, a NMOS transistor 102, and an inverter circuit 91. The PMOS transistor 103 and the NMOS transistor 102 are connected in series between the voltage source V2 and the ground. Drains of the PMOS transistor 103 and the NMOS transistor 102 are both connected to the source line SL. Further, a gate of the PMOS transistor 103 is connected to the wiring of the reset signal RESET0 via the inverter circuit 91. A gate of the NMOS transistor 102 is connected to the wiring of the set signal SET0.

In the configuration described above, when DATA0 is "1" during the SET write operation (the set signal SET0 is at a high level), the PMOS transistor 94 and the NMOS transistor 95 turn on and the NMOS transistors 96 and 97 turn off in the first write circuit 51. As a result, the write voltage V1 is supplied to the bit line BL. At this time, the NMOS transistor 102 turns on in the second write circuit 52a, and the source line SL goes to the potential VSS. Therefore, for instance, a current flows through the variable resistance element 8 of the memory cell 1a in the direction from A to B in FIG. 4, and a SET write is performed.

When DATA0 is "1" during the RESET write operation (the reset signal RESET0 is at a high level), the PMOS transistor 94 and the NMOS transistor 95 turn off and the NMOS transistors 96 and 97 turn on. As a result, the bit line BL goes to the potential VSS. At this time, the PMOS transistor 103 turns on in the second write circuit 52a, the write voltage V2 is supplied to the source line SL. Therefore, for instance, a current flows through the variable resistance element 8 of the memory cell 1a in the direction from B to A in FIG. 4, and a RESET write is performed.

Next, the configuration, of the reading unit 21 in FIG. 4 will be described. In the reading unit 21, a reading unit (34a, 35b, etc.) for each bit is provided for each bit line BL, which is connected to the corresponding writing unit for each bit. As shown in FIG. 4, the reading unit (34a, 35b, etc.) for each bit is constituted by including the read circuit 54, the first reference resistance circuit 41, and the second reference resistance circuit 42.

Figure 8:
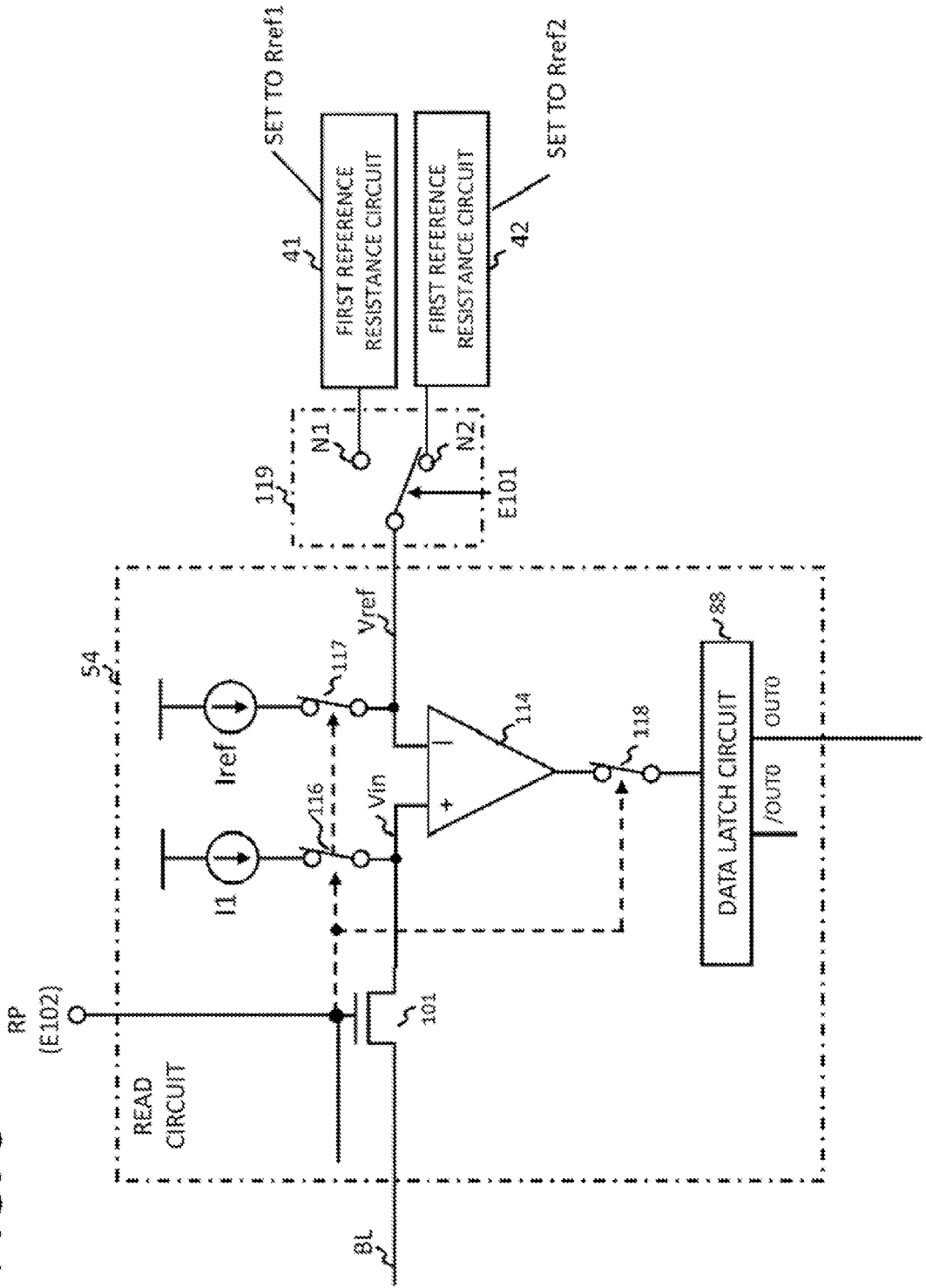
FIG. 8 is a circuit diagram of a read circuit of the semiconductor memory device relating to the first exemplary embodiment.

FIG. 8 shows a circuit diagram of the read circuit of the semiconductor memory device relating to the first exemplary embodiment.

The configurations of the read circuit 54 and the first and second reference resistance circuits (41 and 42) will be described with reference to FIG. 8. As shown in FIG. 8, the read circuit 54 is constituted by including a read current source 11, a reference current source Iref, a differential amplifier circuit 114, a data latch circuit 88, an NMOS transistor 101, and switches 116 to 118. The differential amplifier circuit 114 compares a voltage Vin of a non-inverting input terminal to a voltage Vref of an inverting input terminal, the data latch circuit 88 latches read data according to the difference therebetween, and an output signal OUT0 is outputted.

The NMOS transistor 101 electrically connects the bit line BL to the non-inverting input terminal of the differential amplifier circuit 114 during a read operation (a read pulse signal RP is at a high level). Further, the switches 116 and 117 switch on/off between the read current source 11 and the non-inverting input terminal of the differential amplifier circuit 114 and between the reference current source Iref and the inverting input terminal of the differential amplifier circuit 114, respectively, in conjunction with the read pulse signal RP. The switch 118, provided between an output terminal of the differential amplifier circuit 114 and an input terminal of the data latch circuit 88, also switches on/off in conjunction with, the read pulse signal RP.

Further, switching between N1 and N2 in a switch circuit 119 is controlled by the control signal E101 from, the array control circuit 20. When the switch 119 is controlled to select N1, a resistor (set to Rref1) of the first reference resistance circuit 41 is electrically connected to the inverting input terminal of the differential amplifier circuit 114. When the switch 119 is controlled to select N2, a resistor (set to Rref2) of the second reference resistance circuit 42 is electrically connected to the inverting input terminal of the differential amplifier circuit 114.

During a read operation (the read pulse signal RP is at a high level), the read current source 11 supplies a current to the variable resistance element 8 of a selected memory cell via the hit line BL. Similarly, the reference current source Iref supplies a current to the first or second reference resistance circuit (41 or 42), whichever is selected by the switch 119. Here, the resistance selected by the switch 119 from the first and second reference resistance circuits (41 and 42) is referred to as the "selected reference resistance."

As a result, by having the differential amplifier circuit 114 compare the voltages Vin and Vref, the resistance of the variable resistance element 8 of the selected memory cell and the selected reference resistance (Rref1 or Rref2) can be compared. In other words, the selected reference resistance (Rref1 or Rref2) becomes the reference for the logic judgment during read operation. More concretely, when the resistance of the variable resistance element 8 is greater than the selected reference resistance, Vin is greater than Vref, the device is determined to be in the high resistance state, and the data latch circuit 88 outputs the logic value "0." Conversely, when the resistance of the variable resistance element 8 is less than the selected reference resistance, Vin is less than Vref, the device is determined to be in the low resistance state, and the data latch circuit 88 outputs the logic value "1."

FIGS. 9A and 9B show circuit diagrams of the first and second reference resistance circuit in the semiconductor memory device relating to the first exemplary embodiment.

Next, the configurations of the first and second reference resistance circuits (41 and 42) will be described with reference to FIGS. 9A and 9B. FIGS. 9A and 9B are circuit diagrams showing the first and second reference resistance circuits 41 and 42, respectively. The configurations shown in FIGS. 9A and 9B are the same, except that the trim signals TR1 <m:0> and TR2 <m:0> supplied thereto are different. In FIG. 9A, series connections of the selection transistor and the resistor is connected in parallel (M0 and R0, M1 and R1, M2 and R2, . . . , Mm and Rm). The trim signal TR1 <m:0> is supplied to a gate of each of the selection transistors (M0 to Mm), which are on/off controlled. As a result, the resistor connected to a selection transistor in an on-state is selected. By adjusting the trim signal TR1 <m:0>, the resistance value viewed from the terminal N1 is set so as to be close to the desired resistance value Rref1. The adjustment of the trim signal TR1 <m:0> is performed daring testing such as when a shipping adjustment is made, and the adjusted trim signal TR1 <m:0> is stored in a fuse or a CAM region, etc.

Similarly, in FIG. 9B, by adjusting the trim signal TR2 <m:0>, the resistance value viewed from, the terminal N2 is set so as to be close to the desired resistance value Rref1. Note that Rref1 is greater than Rref2 (described in detail later).

Next, switching between N1 and N2 by the switch 119 will be described. When the memory cells in the special memory region 11 of the memory cell array 10 shown in FIG. 4 are read, the switch 119 selects N1, providing the resistance (Rref1) of the first reference resistance circuit 41. When the memory cells in the normal memory region 12 of the memory cell array 10 shown in FIG. 4 are read, the switch 119 selects N2, providing the resistance (Rref2) of the second reference resistance circuit 42.

Operation of First Exemplary Embodiment

Next, an operation of the first exemplary embodiment will be described. The semiconductor memory device 100 relating to the first exemplary embodiment is resin-sealed in a package and shipped, and then it is soldered to a board by a user (a manufacturer who incorporates the semiconductor memory device 100 into an end product) and is built into an end product. The following operation description is divided into the operation of a shipping adjustment when the semiconductor memory device 100 is manufactured, and the operation after a user has built it into an end product.

(Shipping Adjustment Operation)

An operation of the shipping adjustment for the semiconductor memory device 100 relating to the first exemplary embodiment will be described with reference to FIG. 10.

Figure 10:
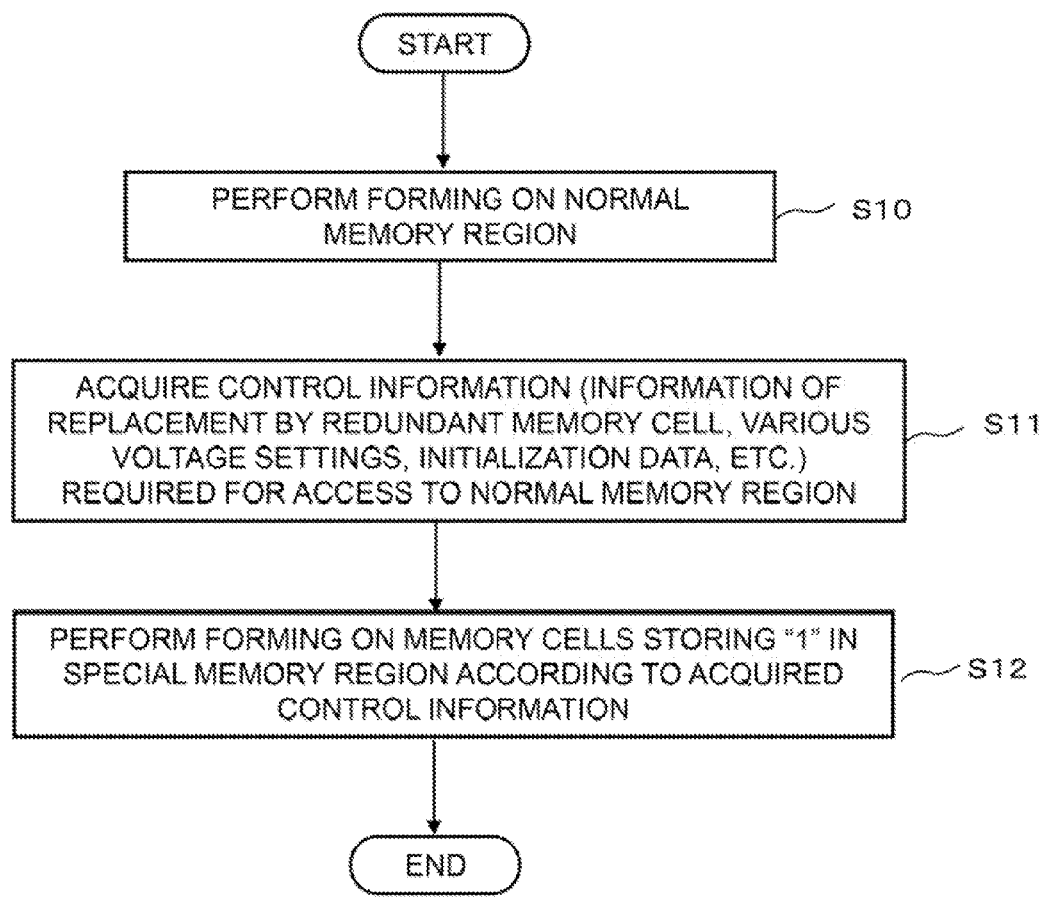
FIG. 10 is a flowchart showing a write method for the semiconductor memory device relating to the first exemplary embodiment.

FIG. 10 is a flowchart showing a write method for the semiconductor memory device 100 and shows a forming at the time of the shipping adjustment.

First, in step S10, a forming is performed on the normal memory region 12 of the memory cell array 10, As a result, a filament path is formed inside the variable resistor 7 in a super high resistance state after film formation, and it becomes possible to reversibly change the electrical resistance of the variable resistor 7 by applying a write voltage thereafter. The forming is per formed by having the forming circuit 53 shown in FIG. 5 apply the forming voltage V3 to the variable resistance element 8.

In step S11, in FIG. 10, the control information C1 required for access to the normal memory region 12 is acquired. The control information C1 includes the information of replacement by a redundant memory cell, various voltage settings, and initialization data. The information of replacement by a redundant memory cell is information for replacing a faulty memory cell detected during the factory inspection with a redundant memory cell and accessing it.

Further, individual product information (such as a product number) may be written in the control information C1.

In the step S12, in FIG. 10, the acquired control information C1 is stored in the special memory region 11. More concretely, a forming is performed on the special memory cells (the first memory cells) that store the logic value "1" in the special memory region 11. A forming is not performed on the special memory cells (the second memory cells) that store the logic value "0" in the special memory region 11. As a result, the logic values "1" and "0" of the control information C1 are stored in the special memory region 11 by "performing a forming" and "not performing a forming."

The forming in the step S10 is performed on the normal memory region 12 in its entirety whereas the forming in the step S12 is performed selectively on the memory cells MC selected by addresses in the special memory region 11.

Note that the order of the formings in the steps S10 and S12 may be reversed from that in FIG. 10.

The shipping adjustment on the semiconductor memory device 100 during manufacturing is completed as described before shipment.

(Operation after Built into Product)

Next, the semiconductor memory device 100 is shipped, soldered to a board, and built into an electronic device, the end product. As described in Patent Literature 1, a high-temperature treatment is performed on the semiconductor memory device 100 at about 260 degrees Celsius during a solder reflow treatment.

Then, when the electronic device having the semiconductor memory device 100 built therein is powered on, the semiconductor memory device 100 detects the power activation and activates the RY/BY terminal for approximately 100 μseconds as an initialization period. The semiconductor memory device 100 reads the control information C1 written in the special memory region 11 during this period.

In the first exemplary embodiment, reading of the control information C1 will not have any issue even after the high temperature treatment (such as a solder reflow treatment) has been performed on the special memory region 11. The mechanism thereof will be described below with reference to FIGS. 12A, 12B, 13A and 13B.

FIG. 12 shows the read margin in a comparative example.

Figure 12A:
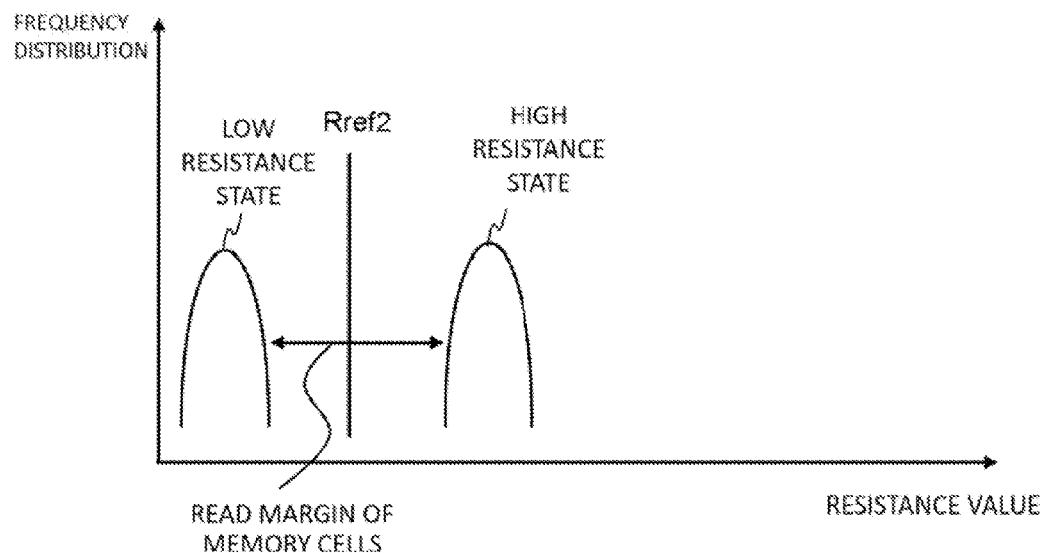
FIGS. 12A and 12B are drawings for explaining a read margin in a comparative example.

The comparative example is a general write method for a variable resistance element in a ReRAM its which the logic values "1" and "0" are stored in some parts of a memory cell array by SET and RESET writes, respectively, after a forming is performed on the entire memory cell array. FIG. 12A shows the frequency distribution of high and low resistance states before a high-temperature treatment. As shown in FIG. 12A, it is desired that Rref2, the reference for the logic judgment, be set to be in the middle between the low resistance state and the high resistance state.

Figure 12B:
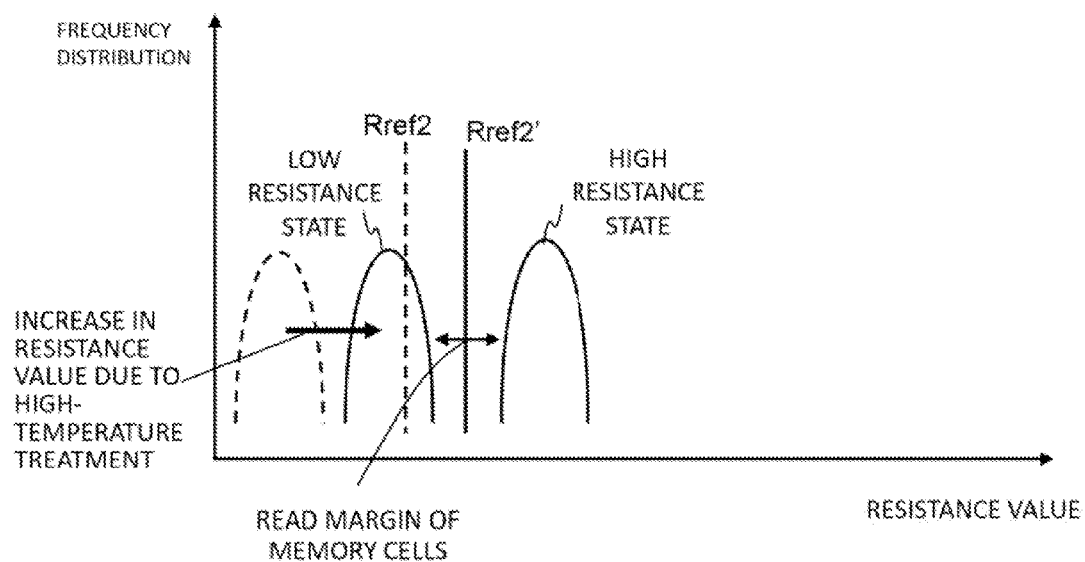

In FIG. 12B, the resistance values of the low resistance state increase due to the influence of the high-temperature treatment. As a result, the read margin is reduced as shown in FIG. 12B. It is desired that the reference for the logic judgment during read operation be as high as Rref2', but the accuracy of read operations may suffer if the resistance values further increase due to the high-temperature treatment.

Figure 13A:
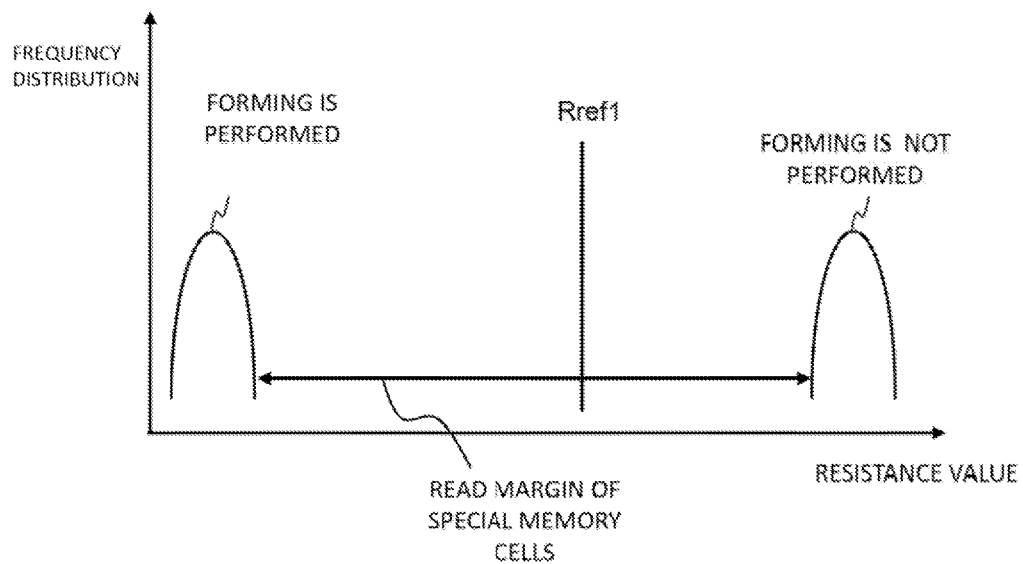
FIGS. 13A and 13B are drawings for explaining a read margin in the first exemplary embodiment.
Figure 13B:
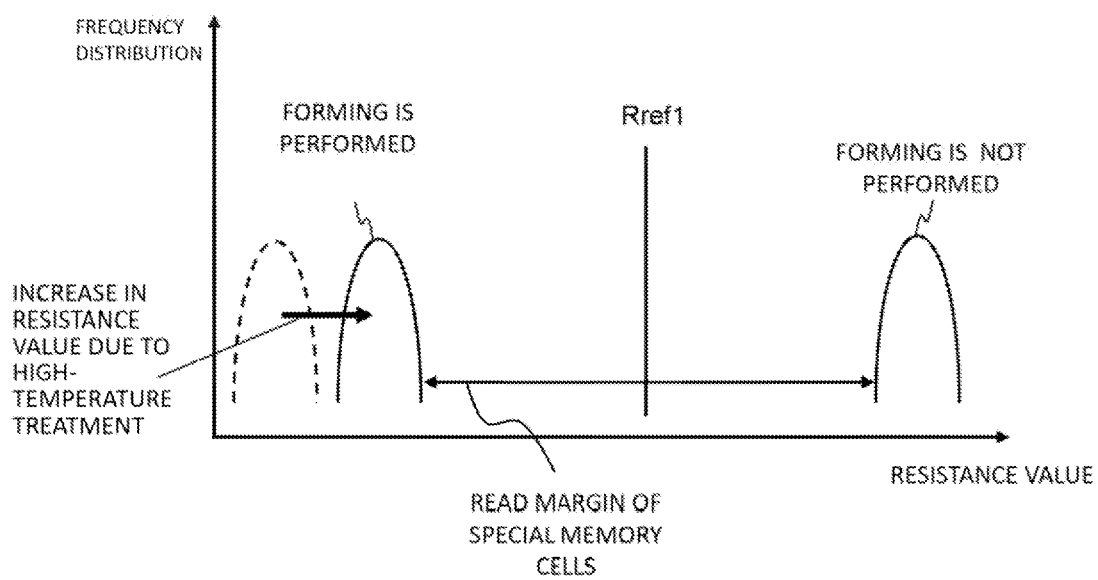

FIGS. 13A and 13B show the read margin in the first exemplary embodiment.

FIG. 13A shows the frequency distributions in the special memory region in states treated with a forming and not treated with a forming before a high-temper a tare treatment. The resistance in the state treated with a forming is close to the resistance state after a SET write. FIG. 13B shows the frequency distributions in the special memory region in the states treated with a forming and not treated with a forming after a high-temperature treatment. As shown in FIG. 13B, the frequency distribution of the state treated with a forming has higher resistance values as in FIG. 12B. The state not treated with a forming, however, is in a super high resistance state, and FIG. 13B indicates that a sufficient read margin can be obtained. Further, in FIG. 13B, it is desired that Rref1, the reference for the logic judgment during read operation, be set to be in the middle between the frequency distributions of the states treated with a forming and not treated with a forming. In other words, Rref1 is set to a greater value than Rref2 and Rref2'. As described, the first exemplary embodiment is able to obtain a sufficient read margin even when the control information C1 is affected by a high-temperature treatment, compared to the comparative example.

As described, the fact that the difference between the state of the special memory region not treated with a forming (the super high resistance state; the second resistance state) and the state treated with a forming (the first resistance state) in FIG. 13B is sufficiently larger than the difference between the high resistance state (the third resistance state) and the low resistance state (the fourth resistance state) in FIG. 12B leads to the sufficient read margin in FIG. 13B. The read margins shown in FIGS. 13A and 13B are larger than any of the read margins shown in FIGS. 12A and 12B since the state not treated with a forming is used as the values on the high resistance side in FIGS. 13A and 13B.

The control information C1 read during the power on is set in a redundant circuit (that replaces a faulty cell with a redundant cell) not shown in the drawings. Further, setting the reference resistance value Rref1 for the logic judgment during read operation to a large value such as in FIGS. 13A and 13B increase the read time. However, no problem will occur even if the speed of reading the control information C1 during power on is greatly slower than the speed of reading the normal memory region 12 during normal operation.

Then, the semiconductor memory device 100 enters into a normal operation mode, and operations such as a SET write, RESET write, and read are performed on the normal memory cells in the normal memory region 12. Further, during a read operation in the normal operation mode, the switch 119 selects N2 and the reference resistance value for the logic judgment during the read operation is Rref2.

As described above, in the semiconductor memory device 100 relating to the first exemplary embodiment, since the logic values "1" and "0" of the control information C1 written to the variable resistance element during the shipping adjustment are recorded by "performing a forming" and "nor performing a forming," the difference between the two resistance sates can be made sufficiently large. As a result, a sufficient read margin can be obtained despite the fact that the resistance value of the memory-cells treated with a forming increases due to the high-temperature treatment (such as a solder reflow treatment) when the semiconductor memory device 100 is built into a board of an end product. In other words, the corruption of the stored control information C1 caused by the high-temperature treatment can be prevented.

The semiconductor memory device 100 relating to the first exemplary embodiment is able to store information with a larger read margin, improving the reliability of information storage.

Further, in the first exemplary embodiment, the control information C1 stored in the special memory region 11 is stored by "performing a forming" and "not performing a forming," however, the present invention is not limited thereto. As long as one of the storage states of the control information C1 is the super high resistance state doe to the avoidance of a forming, the other storage state may be, for instance, the low resistance state (the low resistance state after a SET write) or the high resistance state (the high resistance state after a RESET write).

Further, after the control information C1 stored in the special memory region 11 has been read and stored in predetermined memory cells in the normal memory region 12, a forming may be performed on the memory cells in the special memory region 11 not treated with a forming to use the memory cells in the special memory region 11 during normal operation. As a result, the number of memory cells used during normal operation can be increased.

Modification of First Exemplary Embodiment

Figure 14:
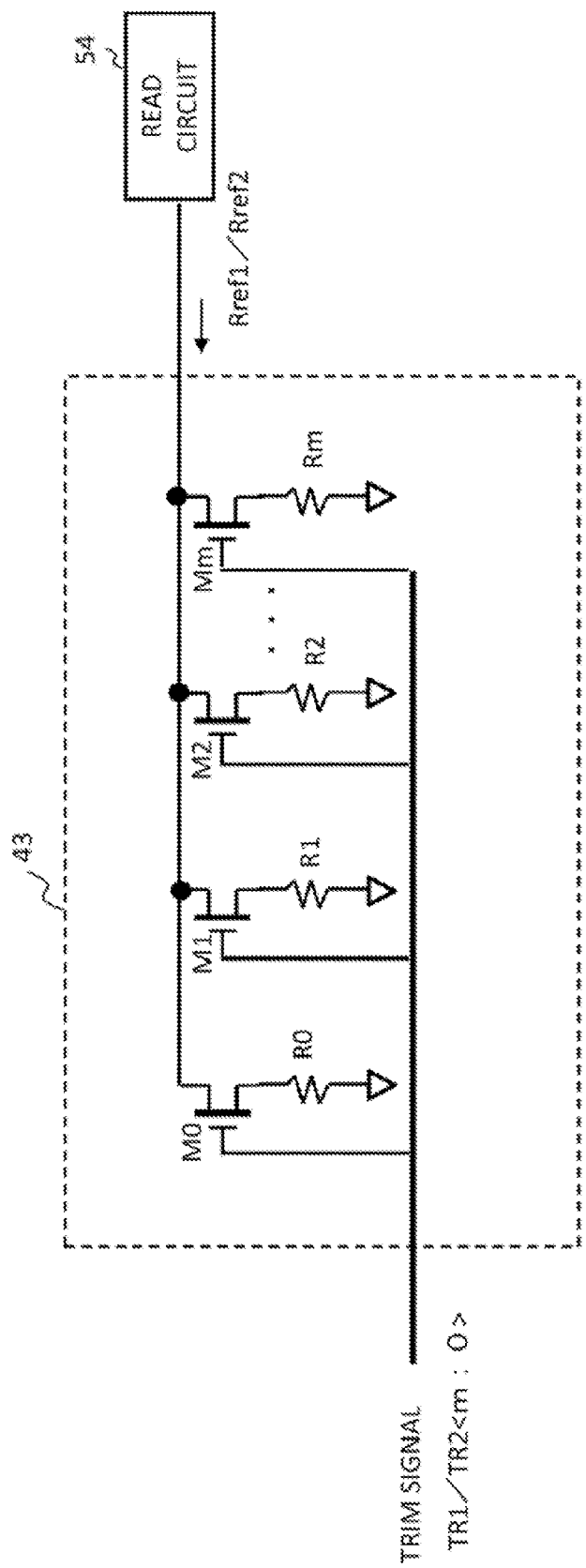
FIG. 14 is a drawing for explaining a reference resistance circuit of a semiconductor memory device relating to a variation of the first exemplary embodiment.

Next, a modification of the first exemplary embodiment will be described with reference to FIG. 14. The modification of the first exemplary embodiment differs from the first exemplary embodiment in that the first and second reference resistance circuits (41 and 42) in the first exemplary embodiment are constituted by the common reference resistance circuit 43. The same reference signs are given to the other components, and duplicate descriptions will be omitted. As explained in the first exemplary embodiment, the first reference resistance circuit 41 (set to Rref1) is used when the special memory region 11 is read, and the second reference resistance circuit 42 (set to Rref2) is used when the normal memory region 12 is read. Since the special memory region 11 and the normal memory region 12 are never read simultaneously, the first and second reference resistance circuits can be constituted by the single reference resistance circuit 43 its shown in FIG. 14. The trim signal TR1 <m:0> is supplied to the reference resistance circuit 43 when the special memory region 11 is read, and the trim signal TR2 <m:0> is supplied to the reference resistance circuit 43 when the normal memory region 12 is read.

As described, according to the modification of the first exemplary embodiment, the effect of reducing the circuit scale can be obtained by combining the first and second reference resistance circuits (41 and 42) of the first exemplary embodiment, compared to the first exemplary embodiment.

The present invention can be applied to a semiconductor memory device comprising a nonvolatile memory cell. Further, the variable resistance element used in the semiconductor memory device of the present invention may be based on any operating principle as long as the resistance value of the element can be changed by supplying a current through the resistor thereof.

It should be noted that other objects, features and aspects of the present invention will become apparent in the entire disclosure and that modifications may be done without departing the gist and scope of the present invention as disclosed herein and claimed as appended herewith. Also it should be noted that any combination of the disclosed and/or claimed elements, matters and/or items may fail under the modifications aforementioned. Particularly, regarding the ranges of the numerical, values used in the present description, it should be understood that a numeric value or small range included in these ranges is concretely listed even when no specific explanation is provided.

What is claimed is:

1. A semiconductor device, comprising:
  a memory cell array comprising a plurality of first and second memory cells each comprising a variable resistance element that establishes an electrical resistance that changes in response to an application of a write voltage after a forming voltage has been applied;
  the first memory cell to which the forming voltage is applied, and
  the second memory cell to which the forming voltage is not applied, and the second memory cell being configured to store one of first and second logic values constituting first information, the first and second logic values being different from each other.

2. The semiconductor device according to claim 1, wherein the first memory cell is configured to store the other one of the first and second logic values constituting the first information.

3. The semiconductor device according to claim 1, wherein the first information is control information for controlling the semiconductor device.

4. The semiconductor device according to claim 1, wherein the first information includes redundancy information for replacement with a redundant memory cell.

5. The semiconductor device according to claim 1, wherein the memory cell array further includes a third memory cell to which the forming voltage is applied, and
the third memory cell is configured to store second information different from the first information in response to application of the write voltage.

6. The semiconductor device according to claim 5, wherein the second information is normal information used by a user.

7. The semiconductor device according to claim 5, wherein the first and second memory cells store information for controlling the third memory cells.

8. The semiconductor device according to claim 5, wherein a difference between a first resistance value indicated by the first memory cell and a second resistance value indicated by the second memory cell is greater than a difference between third and four resistance values indicated by the third memory cell in response to application of the write voltage.

9. The semiconductor device according to claim 1, wherein the first memory cell is in a state in which the electrical resistance of the variable resistor reversibly changes in response to the application of the write voltage, and
the second memory cell is in a state in which the electrical resistance of the variable resistor does not reversibly change in response to the application of the write voltage.

10. The semiconductor device according to claim 1, wherein
a resistance value of the second memory cell is greater than that of the first memory cell.

11. The semiconductor device according to claim 1, further comprising:
a read circuit reading data stored in the memory cells, wherein
the read circuit is configured to receive a first reference resistance value as a reference for a logic judgment performed when the first and second memory cells are read, and a second reference resistance value as a reference for a logic judgment performed when the third memory cell is read, and the first reference resistance value being greater than the second reference resistance value.

12. The semiconductor device according to claim 11, further comprising:
a first reference resistance circuit providing the read circuit with a resistance corresponding to the first reference resistance value; and
a second reference resistance circuit that provides the read circuit with a resistance corresponding to the second reference resistance value.

13. The semiconductor device according to claim 12, wherein
each of the first and second reference resistance circuits is constituted by a plurality of series connections of a selection transistor and a resistor that are connected in parallel to each other.

14. The semiconductor device according to claim 12, wherein
each of the first and second reference resistance circuits comprise a reference resistance circuit in common.

15. The semiconductor device according to claim 1, wherein
each of the memory cells is a ReRAM (Resistive Random Access Memory).

16. A method comprising:
performing a write operation, on a plurality of memory cells each comprising a variable resistance element to write first information including first and second logic values that are different from each other, and the write operation comprising:
storing the first logic value in a first one of the memory cells by applying a forming voltage to the first one of the memory cells; and
storing the second logic value in a second one of the memory cells by not applying the forming voltage to the second one of the memory cells.

17. The method according to claim 16, wherein
the first information is control information that controls a third memory cell configured to store normal information.

18. The method according to claim 16, wherein
the first information includes redundancy information for replacement with a redundant memory cell.

19. The method according to claim 16, wherein
each of the plurality of memory cells is a ReRAM (Resistive Random Access Memory).

20. The method according to claim 16, wherein
the first resistance state is a state in which the electrical resistance of the variable resistor reversibly changes in response to application of the write voltage between the first and second electrodes, and
the second resistance state is a state in which the electrical resistance of the variable resistor does not reversibly change in response to application of the write voltage between the first and second electrodes.

* * * * *